(12) United States Patent
Kim et al.

(10) Patent No.: US 12,557,551 B2
(45) Date of Patent: Feb. 17, 2026

(54) FLEXIBLE THERMOELECTRIC DEVICE HAVING RADIATIVE COOLING PART AND METHOD OF MANUFACTURING RADIATIVE COOLING PART

(71) Applicant: Industry-Academic Cooperation Foundation, Yonsei University, Seoul (KR)

(72) Inventors: Woochul Kim, Seoul (KR); Kyeong Man Roh, Seoul (KR); Salman Khan, Seoul (KR); Ji Yong Kim, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 17/577,114

(22) Filed: Jan. 17, 2022

(65) Prior Publication Data

US 2022/0231213 A1    Jul. 21, 2022

(30) Foreign Application Priority Data

Jan. 18, 2021    (KR) .......................... 10-2021-0006597

(51) Int. Cl.
*H10N 10/17*    (2023.01)
*H10N 10/01*    (2023.01)

(52) U.S. Cl.
CPC ............. *H10N 10/17* (2023.02); *H10N 10/01* (2023.02)

(58) Field of Classification Search
CPC .. H01L 35/32; H01L 35/34; A61F 2007/0075; A41D 31/04; H10N 10/17; H10N 10/01
See application file for complete search history.

(56) References Cited

U.S. PATENT DOCUMENTS

2007/0271669 A1 * 11/2007 Bansal .............. B29C 66/72343
2/69
2012/0055527 A1    3/2012 Zika-Beyerlein
2012/0211044 A1    8/2012 Kurihara et al.
(Continued)

FOREIGN PATENT DOCUMENTS

GB          2585045 A  * 12/2020 ............. H01L 35/28
JP      2012174940 A     9/2012
(Continued)

OTHER PUBLICATIONS

Mandal, "Hierarchically porous polymer coatings for highly efficient passive daytime radiative cooling", Science 362, 315-319 (2018) (Year: 2018).*

(Continued)

*Primary Examiner* — Devina Pillay
(74) *Attorney, Agent, or Firm* — The Webb Law Firm

(57) ABSTRACT

The present invention relates to a flexible thermoelectric device that may be combined and attached to a curved surface and generates an electromotive force based on a temperature difference between one surface and the other surface, and more particularly, to a flexible thermoelectric device having a radiative cooling part which improves power generation performance by increasing cooling efficiency of a cooling side through radiative cooling and minimizes a volume of a heat dissipating part, and a method of manufacturing a radiative cooling part.

7 Claims, 4 Drawing Sheets

(56) References Cited

U.S. PATENT DOCUMENTS

| | | | | |
|---|---|---|---|---|
| 2013/0085552 A1* | 4/2013 | Mandel | ............... | A61F 7/007 |
| | | | | 607/99 |
| 2013/0087180 A1* | 4/2013 | Stark | ............... | H10N 10/13 |
| | | | | 136/205 |
| 2018/0014585 A1* | 1/2018 | Polonio | ............... | A41D 27/00 |
| 2019/0008217 A1* | 1/2019 | Cui | ............... | D06M 17/00 |
| 2019/0378967 A1* | 12/2019 | Morita | ............... | H02N 11/00 |
| 2022/0013704 A1* | 1/2022 | Chen | ............... | A41D 31/04 |

FOREIGN PATENT DOCUMENTS

| | | |
|---|---|---|
| JP | 2019179912 A | 10/2019 |
| JP | 2020145239 A | 9/2020 |
| KR | 1020180097907 A | 9/2018 |
| KR | 102036071 B1 | 10/2019 |
| KR | 1020190118755 A | 10/2019 |
| KR | 1020200061074 A | 6/2020 |
| KR | 1020200103458 A | 9/2020 |

OTHER PUBLICATIONS

Mandal, "Hierarchically porous polymer coatings for highly efficient passive daytime radiative cooling" Mandal et al., Science 362, 315â319 (2018) and Supplementary Material pp. 1-28 (Year: 2008).*

* cited by examiner

【FIG. 1】
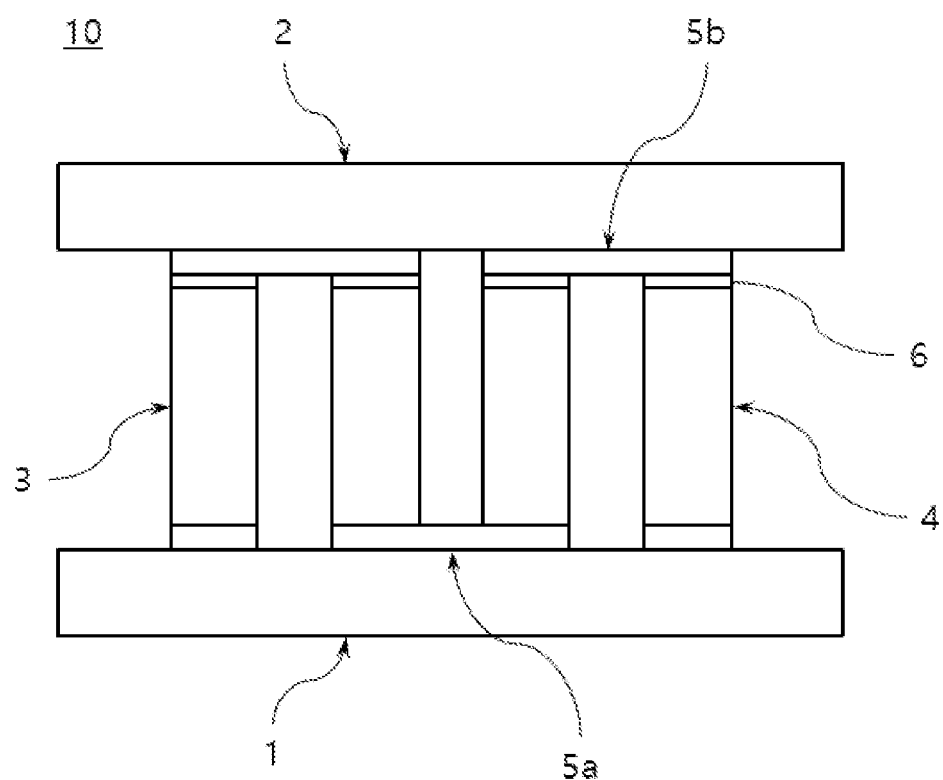

[FIG. 2]
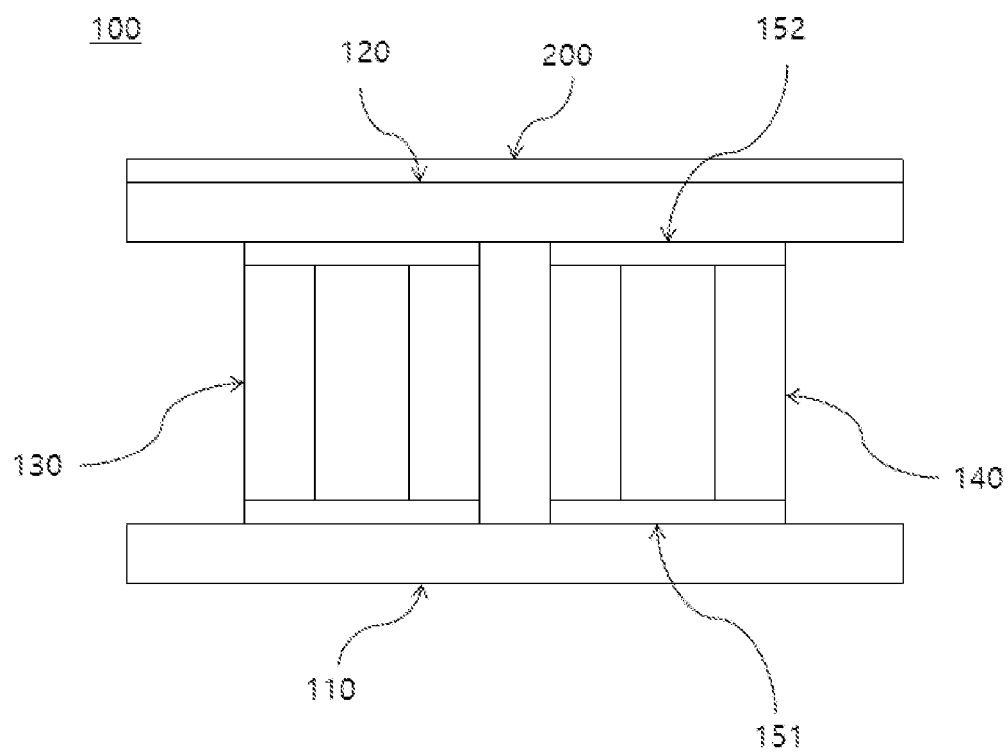

[FIG. 3]
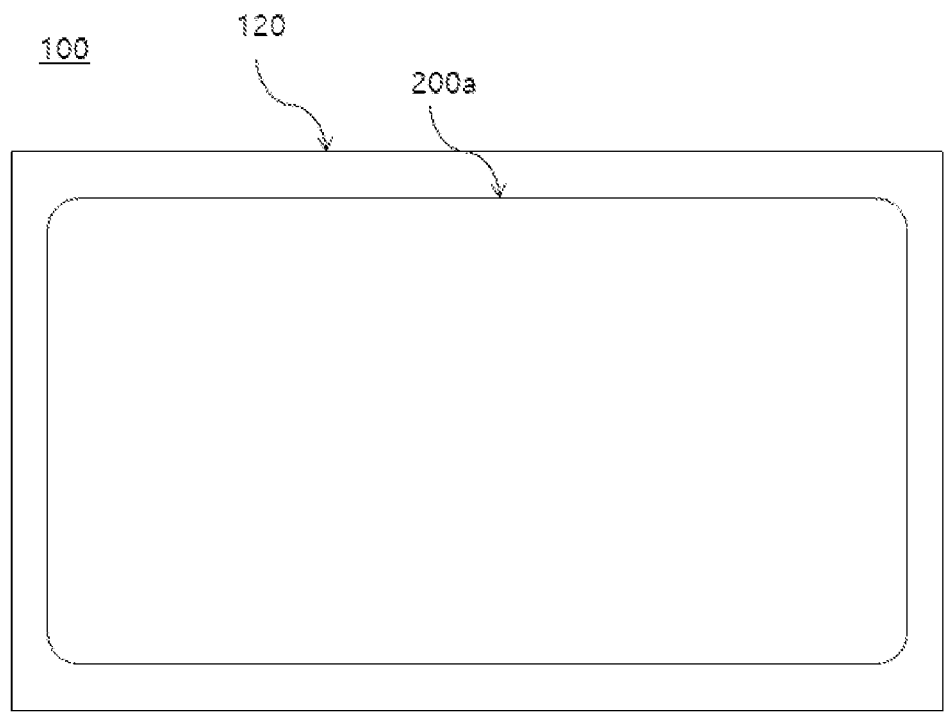
[FIG. 4]
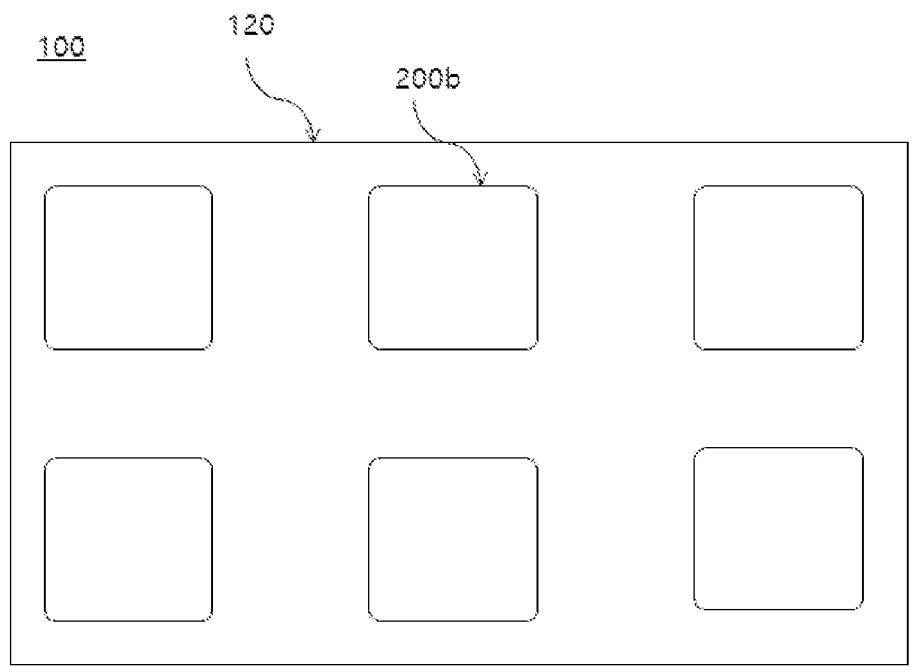

[FIG. 5]
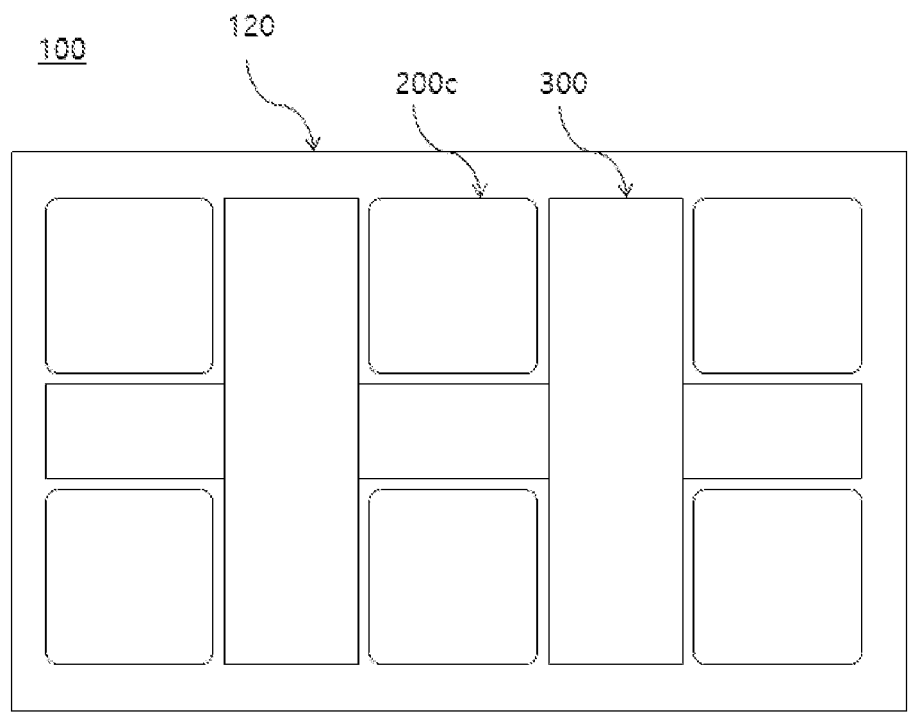

FLEXIBLE THERMOELECTRIC DEVICE HAVING RADIATIVE COOLING PART AND METHOD OF MANUFACTURING RADIATIVE COOLING PART

CROSS-REFERENCE TO RELATED APPLICATION

This application claims priority to Korean Patent Application No. 10-2021-0006597 filed Jan. 18, 2021, the disclosure of which is hereby incorporated by reference in its entirety.

TECHNICAL FIELD

The present invention relates to a flexible thermoelectric device that may be combined and attached to a curved surface and generates an electromotive force based on a temperature difference between one surface and the other surface, and more particularly, to a flexible thermoelectric device having a radiative cooling part which improves power generation performance by increasing cooling efficiency of a cooling side through radiative cooling and minimizes a volume of a heat dissipating part, and a method of manufacturing a radiative cooling part.

BACKGROUND

A thermoelectric material, a material enabling conversion between thermal energy and electric energy by the Seebeck effect and Peltier effect, has been widely applied to electronic cooling and thermoelectric power generation. An electronic cooling module and a thermoelectric power module using a thermoelectric material have a structure in which n-type thermoelectric legs and p-type thermoelectric legs are electrically connected in series and thermally in parallel. When a thermoelectric module is used for electronic cooling, heat is pumped from a cooling substrate to a heating substrate by migration of holes and electrons in n-type and p-type thermoelectric devices, respectively, by applying a direct current to the module, thereby cooling the cooling substrate. Meanwhile, in the case of thermoelectric power generation, when heat is transferred from a high-temperature end to a low-temperature end of the module due to a temperature difference between the high-temperature end and the low-temperature end, holes and electrons in the p-type and n-type thermoelectric devices migrate from the high-temperature end and the low-temperature end, respectively, thereby generating an electromotive force by the Seebeck effect.

Electronic cooling modules have the advantage of high thermal response sensitivity, local selective cooling, and a simple structure without an operating part, and as such, electronic cooling modules have been put to practical use for local cooling of electronic components such as LD modules for optical communication, high-output power transistors, infrared sensing devices, and CCDs and applied to industrial and commercial thermostats, scientific and medical thermostats. Thermoelectric power generation may be possible when a temperature difference is simply given, providing a wide selection range of heat sources in use and a simple structure and eliminating noise, and thus, the economical use thereof, which was limited to special small power devices including military power supplies, has recently been expanded to thermoelectric generators using industrial waste heat and alternative independent power sources.

FIG. 1 illustrates a schematic cross-sectional view of a typical vertical thermoelectric device 10. As shown, the thermoelectric device 10 includes a first substrate 1, a second substrate 2, a P-type first thermoelectric leg 3, an N-type second thermoelectric leg 4, and an electrode 5. The first substrate 1 has a plate-like shape and is attached to a heat source (not shown), and the second substrate 2 has a plate-like shape, is disposed above the first substrate 1, and is spaced apart from the first substrate 1. Between the first substrate 1 and the second substrate 2, the first thermoelectric leg 3 and the second thermoelectric leg 4 are formed in a vertical and longitudinal direction, and a plurality of the first thermoelectric legs and second thermoelectric legs are spaced apart from each other. The first and second thermoelectric legs 3 and 4 generate electricity according to a temperature difference between the first substrate 1 and the second substrate 2, or a P-type semiconductor and an N-type semiconductor for heating the first substrate 1 or the second substrate 2 through current are alternatively disposed. The electrode 5 includes a lower electrode 5a electrically connecting lower portions of the first and second thermoelectric legs 3 and 4 and an upper electrode 5b electrically connecting upper portions of the first and second thermoelectric legs 3 and 4 so that the first and second thermoelectric legs 3 and 4 are alternately connected in series.

When the thermoelectric device 10 is attached to a heat source having a temperature higher than that of the atmosphere by the above configuration, the P-type and N-type thermoelectric legs 3 and 4 generate power due to a temperature difference between the first substrate 1 in contact with the heat source and the second substrate 2 exposed to the atmosphere and transfer generated electricity through the electrode 5.

In addition, a cooling part is provided on the second substrate 2 to more effectively dissipate heat of the second substrate 2 in order to increase the temperature difference between the first substrate 1 and the second substrate 2 to improve power generation performance. For example, the cooling part may be formed in a shape in which a plurality of fins protrude in order to expand a heat dissipation area of the second substrate 2, or a heat sink using a fluid as a refrigerant may be applied.

Recently, flexible thermoelectric devices in which the first substrate 1 and the second substrate 2 are formed of a flexible material to be attached to curved surfaces such as the body have been developed. When such a fin type cooling part is applied to the second substrate, a volume increases due to a height of the fin, and thus, wearability is deteriorated when attached to the body.

In addition, a fluid refrigerant type cooling part cannot be formed of a flexible material, and thus, it is difficult to apply such a fluid refrigerant type cooling part to flexible thermoelectric devices.

DISCLOSURE

Technical Problem

An embodiment of the present invention has been devised to solve the aforementioned problems, and an object of the present invention is directed to providing a flexible thermoelectric device having a radiative cooling part, in which a heat dissipating part is formed of a radiative cooling material, is applied to a cooling substrate side of the flexible thermoelectric device to minimize an increase in volume of the flexible thermoelectric device, while increasing a temperature difference between a heating substrate of the flexible thermoelectric device and the cooling substrate thereof, and a method of manufacturing the radiative cooling part.

Technical Solution

In one general aspect, a flexible thermoelectric device having a radiative cooling part, including a heat dissipating part formed of a flexible material, wherein the heat dissipating part is formed of a radiative cooling part including a radiative cooling material.

In another general aspect, a flexible thermoelectric device having a radiative cooling part may include a radiative cooling part provided on an outer surface of the heat dissipating part to cool the heat dissipating part by radiative cooling.

The radiative cooling part may be formed of a material emitting infrared rays to cause radiative cooling and may be formed of a material emitting infrared rays in a wavelength range of 8 to 13 micrometers by electromagnetic resonance.

The radiative cooling part may be formed of a thin film and attached to the outer surface of the heat dissipating part.

The radiative cooling part may be attached to the outer surface of the heat dissipating part through an adhesive, and the adhesive may include an epoxy-based resin or an olefin-based resin having high thermal conductivity.

The radiative cooling part may be formed by applying the radiative cooling material on the outer surface of the cooling part.

The radiative cooling part may be provided as a single radiative cooling part in the cooling part and may be formed of a flexible material to maintain a state in close contact with the heat dissipating part formed of a flexible material.

A plurality of the radiative cooling part are stretchable and may be disposed on the heat dissipating part and spaced apart from each other at a predetermined distance so as to be coupled to each other to form a predetermined pattern on the heat dissipating part.

The flexible thermoelectric device may further include a water repellent part provided in a space between the plurality of heat dissipating parts and formed of a water repellent material.

In addition, the radiative cooling part may be in the form of a thin film and coupled to the outer surface of the heat dissipating part and have pores having a diameter of nano or micrometer units.

In another general aspect, a method of manufacturing a radiative cooling part includes: dissolving a radiative cooling material in acetone; stirring the acetone solution in which the radiative cooling material is dissolved; adding deionized water to the stirred solution and additionally stirring; pouring the deionized water-added solution onto a substrate and evaporating a liquid; and separating a cured radiative cooling part from the substrate.

Effect of Invention

The flexible thermoelectric device including a radiative cooling part configured as described above and the method of manufacturing a radiative cooling part of the present invention has an effect of improving power generation performance by increasing a temperature difference of the thermoelectric device by improving cooling performance of a cooling substrate basically using a radiative cooling method.

Additionally, there is an effect of minimizing an increase in volume of the flexible thermoelectric power generation device by minimizing the size of the cooling part applied to the cooling substrate.

In particular, in the case of a flexible thermoelectric generator attached to a human body, an increase in volume thereof is minimized, thereby improving the fit.

In addition, there is an effect of improving durability when attached to the human body by providing a water repellent part formed of a water repellent material between a plurality of radiative cooling parts spaced apart from each other to prevent separation of the radiative cooling part due to moisture contact of the flexible thermoelectric device.

BRIEF DESCRIPTION OF DRAWINGS

FIG. 1 is a cross-sectional schematic view of a general thermoelectric device.

FIG. 2 is a cross-sectional schematic view of a thermoelectric device according to an embodiment of the present invention.

FIG. 3 is a schematic plan view of a thermoelectric device according to a first embodiment of the present invention.

FIG. 4 is a schematic plan view of a thermoelectric device according to a second embodiment of the present invention.

FIG. 5 is a schematic plan view of a thermoelectric device according to a third embodiment of the present invention.

BEST MODE

Hereinafter, an embodiment of the present invention as described above will be described in detail with reference to the drawings.

FIG. 2 is a schematic cross-sectional view of a flexible thermoelectric device 100 to which a radiative cooling part is applied according to an embodiment of the present invention (hereinafter referred to as "thermoelectric device").

As shown, the thermoelectric device 100 includes a heat absorbing part 110, a heat dissipating part 120, a first thermoelectric leg 130, a second thermoelectric leg 140, and electrodes 151 and 152. The heat absorbing part 110 and the heat dissipating part 120 are flexible substrates, and an insulating material may be applied thereto. For example, the heat absorbing part 110 and the heat dissipating part 120 are formed by coating a copper foil with a ceramic film.

The heat absorbing part 110 is formed in a plate-like shape, and the heat dissipating part 120 has a plate-like shape, is disposed above the heat absorbing part 110, and spaced apart from the heat absorbing part 110 by a predetermined distance. Between the heat absorbing part 110 and the heat dissipating part 120, first and second thermoelectric legs 130 and 140 are formed in a vertical, longitudinal direction, and a plurality of first and second thermoelectric legs 130 and 140 are spaced apart from each other. In the first and second thermoelectric legs 130 and 140, a P-type semiconductor and an N-type semiconductor for generating electricity according to a temperature difference between the heat absorbing part 110 and the heat dissipating part 120 are alternately disposed. The electrodes 151 and 152 electrically connect the first and second thermoelectric legs 130 and 140 so that the first and second thermoelectric legs 130 and 140 are alternately connected in series. The lower electrode 151 electrically connects lower portions of the first and second thermoelectric legs 130 and 140 in the drawing, and the upper electrode 152 electrically connects upper portions of the first and second thermoelectric legs 130 and 140.

Meanwhile, the thermoelectric device 100 according to an embodiment of the present invention may be a thermoelectric generation device in which the heat absorbing part 110 is attached to an object to absorb heat generated by the object and generates electricity according to a temperature difference with the heat dissipating part 120. Therefore, the thermoelectric device 100 of the present invention includes a radiative cooling part 200 for cooling the heat dissipating part 120 in order to increase the temperature difference between the heat absorbing part 110 and the heat dissipating part 120. Although it is illustrated that the radiative cooling part 200 is provided on the outside of the heat dissipating part 120, in another embodiment, the heat dissipating part 120 itself may be formed of a radiative cooling part. That is, the heat dissipating part 120 may be formed of a radiative cooling part including a radiative cooling material.

Radiative cooling is a phenomenon in which solar radiant energy absorbed by the Earth is released as Earth's radiant energy, resulting in a decrease in temperature. During the day, the Earth's surface absorbs solar radiant energy, absorbing about 0.5 cal/cm$^2$·min globally.

However, the Earth also emits radiant energy in the form of infrared rays, and in this case, when the amount of radiant energy being emitted is greater than the amount of radiant energy being absorbed, radiative cooling is performed. Usually, the ground surface begins to cool after the sun goes down, but on sunny days when there is no wind, radiative cooling is more active, and the cooling effect of the ground surface is greater.

Therefore, at dawn on a sunny day without wind, the temperature may drop below a dew point due to the radiative cooling of the ground surface. At this time, water vapor in the air condenses to form a fog near the ground surface, which is called radiation fog. Radiation fog is also called ground fog because it occurs easily in inland regions with a large daily temperature difference.

Radiant energy emitted by the Earth is absorbed by water vapor in the atmosphere and returned to the ground surface. This effect serves to insulate the ground surface, which has been cooled by radiative cooling.

Meanwhile, in the process of cooling the system, a cooling method achieved by increasing a proportion of heat transfer based on radiation among the three heat transfer mechanisms of conduction, convection, and radiation is called radiative cooling.

Since cooling using conduction or convective heat transfer is due to a relative temperature difference with the outside temperature, additional work is absolutely necessary to cool below the outside temperature. In contrast, cooling through radiative heat transfer is performed automatically by the absolute temperature of a system surface and radiative properties, thus cooling the system below the outside temperature without additional work.

In particular, in order to improve the radiative cooling performance performed in an external daytime environment, a technology for controlling radiative properties for each major wavelength band is required. In a daytime environment, the transmittance of the atmosphere in a sky window wavelength range of 8 μm to 13 μm is close to 1, so that radiant heat emitted into space may be maximized by implementing high emissivity in the wavelength band. In a wavelength band except for the 8 μm to 13 μm window band, a low absorption rate is required to block absorption of solar heat and atmospheric radiant heat.

That is, in order to implement a radiative cooling system in a daytime environment, it is essential to implement a wavelength-selective radiator with high emissivity in the sky window region of 8 μm to 13 μm and low emissivity in the remaining spectrum except for the above region.

The radiative cooling part 200 of the present invention using the above radiative cooling method is formed of a material capable of causing radiative cooling by emitting infrared rays. Radiative cooling materials emit infrared rays by electromagnetic resonance. For example, when several metal disks are separated by a dielectric and light is incident on the metal disk, resonance occurs with light of a wavelength similar to a size of the metal disk, and the light of the corresponding wavelength is actively absorbed. That is, light in the visible and ultraviolet wavelength bands is easily absorbed by a metal disk having a diameter less than micrometers, and infrared rays in a wavelength range of several micrometers are effectively absorbed by a metal disk having a diameter of several micrometers. The radiative cooling part 200 may be formed in the form of a disk having a size of several micrometers, and thus, the radiative cooling part 200 may effectively absorb infrared rays in a long wavelength region and may not easily absorb but reflect light in the short-wavelength ultraviolet and visible region. In a thermodynamic equilibrium, since an absorption coefficient and a spontaneous emission coefficient are in a proportional relationship, such a material becomes a material that effectively emits infrared rays in a long wavelength region.

In this case, in order to increase the radiative cooling efficiency, it is preferable to use electromagnetic resonance that easily absorbs and emits infrared rays in the wavelength region of 8 μm to 13 μm as described above. That is, heat is emitted into space in a band of 8 μm to 13 μm, and solar heat is made in a band of 0.3 μm to 2.5 μm. Therefore, in order to increase the total amount of cooling, it is important to maximize heat emitted to space and to minimize the absorption of solar heat and atmospheric radiation. To this end, the emissivity should be close to 1 in the sky window region of 8 μm to 13 μm, and the emissivity should be close to 0 in other wavelength bands.

The structure capable of causing electromagnetic resonance is not limited to the disk described above, and may be three-dimensionally distributed in a host material in molecular or particle form, may have a form of a thin film on the substrate, or may have a form distributed in a two-dimensional arrangement on the substrate. The shape may be implemented in various forms, such as a sphere, an ellipsoid, a cylinder, a prism, a polyhedron such as a cuboid, a core-shell structure, and a complex structure with other materials. Examples of such a material may include SiO2, Ta$_2$O$_5$, H$_2$O, P(vdf–hfp)(vinylidene fluoride-co-hexafluoropropylene), and the like.

The radiative cooling part 200 having the above configuration may be attached to the heat dissipating part 120 in the form of a thin film. Also, in another embodiment, the radiative cooling part 200 may be applied to have a predetermined thickness on the heat dissipating part 120. When the radiative cooling part 200 is formed in the form of a thin film, the radiative cooling part 200 may be fixed to the heat dissipating part 120 through an adhesive.

The radiative cooling part 200 may be manufactured in the following manner. First, 1 g of P(vdf–hfp) is dissolved in 15 ml of acetone, a polar solvent. In another embodiment, P(vdf–hfp) may also be dissolved in N,N-dimethyl formamide, N,N-dimethyl acetamide, or N-methyl pyrrolidone, etc. However, considering toxicity, stability, and accessibility of the solvent, acetone may be preferably used.

Next, the mixture is stirred for 1 hour under the conditions of 70° C. and 600 rpm in a stirrer. Next, 1 ml of deionized water (DI water) is added to the stirred solution, and the mixture is further stirred for about 2 hours until it becomes transparent. In order to manufacture the radiative cooling part 200 in the form of a thin film with nano/micro pores, a process of mixing a solution in which P (vdf–hfp) is dissolved and a liquid that cannot dissolve P (vdf–hfp) to prepare a mixed solution is required. Deionized water or methanol may be applied as a liquid that cannot dissolve P(vdf–hfp), and since deionized water has a relatively stronger tendency to not mix with a P(vdf–hfp) solution, compared to methanol, a process of converting a liquid polymer into a solid phase through subsequent evaporation may be accelerated. Therefore, a time required for forming the thin film quality of the radiative cooling part 200 through the above deionized water adding and stirring process.

Next, when the final stirred solution is poured on the thin copper substrate, acetone evaporates first and then water evaporates to form the P(vdf–hfp) radiative cooling part 200 in which nano/micro pores are formed. More specifically, when the mixed solution after the stirring process is poured onto the substrate, acetone evaporates first at room temperature due to a difference in the heat of vaporization, and a gel from which translucent acetone has escaped is formed. Thereafter, a white thin film is formed in the process of evaporating water left in the gel. Since water cannot dissolve P(vdf–hfp), nano/micro pores are formed in the thin film during evaporation. A size of the nano/micro pores tends to decrease as the amount of water being used increases, but the emissivity of the thin film does not change significantly. When nano/micro-sized pores are formed, the emissivity is significantly improved, compared to a thin film without pores.

The radiative cooling part 200 in the form of a thin film manufactured through the above process is fixed to the heat dissipating part 120 using polymethylmethacrylate (PMMA), which is one of the acrylic adhesives.

In this case, the adhesive may be formed of a thermally conductive resin including an adhesive component in another embodiment. For example, among the resin components known to be generally used as adhesives, an acrylic resin, a urethane-based resin, and a silicone-based resin have similar thermal conductivity properties, and an epoxy-based resin has superior thermal conductivity comparatively, and an olefin-based resin is known to have high thermal conductivity compared to the epoxy resin. Therefore, resins having excellent thermal conductivity may be selected as needed. However, in general, it is difficult to secure the desired thermal conductivity with only the resin component, and a method of including a filler component having excellent thermal conductivity in an appropriate ratio in the adhesive may also be applied.

The radiative cooling part 200 may be formed to have a thickness of 500 micrometers to 1000 micrometers, and more preferably, may be formed to have a thickness of about 800 micrometers. When the thickness of the radiative cooling part 200 is less than 500 micrometers, there is a disadvantage in that visible light reflectance decreases as the thickness is reduced, and when the thickness of the radiative cooling part 200 is equal to or greater than 500 micrometers, an optical physical difference due to thickness is almost constantly maintained. Therefore, when the thickness of the radiative cooling part 200 is equal to or greater than 500 micrometers, a desired radiative cooling and heat dissipation effect may be obtained, but if the radiative cooling part 200 is too thick, the flexibility is lowered, so that it is difficult to apply the radiative cooling part 200 to a flexible thermoelectric device. That is, in the case of a wearable flexible thermoelectric device, as the thickness of the radiative cooling part 200 increases, wearing comfort decreases.

FIG. 3 is a plan view of the thermoelectric device 100 to which the radiative cooling part 200a according to a first embodiment of the present invention is applied, and FIG. 4 is a plan view of the thermoelectric device 100 to which a radiative cooling part 200b according to a second embodiment of the present invention is applied. In addition, FIG. 5 is a plan view of the thermoelectric device 100 to which a radiative cooling part 200c according to a third embodiment of the present invention is applied.

As shown in FIG. 3, the radiative cooling part 200a according to the first embodiment of the present invention may have a planar shape capable of covering the entire region of the heat dissipating part 120. When the radiative cooling part 200a is formed of a single unit without a separated space, the radiative cooling part 200a may be formed of an elastic material to maintain a state in close contact with the flexible heat dissipating part 120. Accordingly, when the heat dissipating part 120 is bent and deformed, the radiative cooling part 200a formed of an elastic material may also be deformed to correspond to the heat dissipating part 120 to maintain a state in close contact with the heat dissipating part 120.

In addition, as shown in FIG. 4, a plurality of radiative cooling parts 200b according to the second embodiment of the present invention are coupled to form a predetermined pattern on the heat dissipating part 120 and spaced apart from each other at a predetermined distance on the heat dissipating part 120. When the radiative cooling part 200b is disposed in a pattern shape as above, average emissivity may be increased, compared to the embodiment described above.

In addition, as shown in FIG. 5, a plurality of radiative cooling parts 200c according to the third embodiment of the present invention may be coupled to form a predetermined pattern on the heat dissipating part 120 and spaced apart from each other at a predetermined distance on the heat dissipating part 120. In this case, a water repellent part 300 may be provided in a space between the plurality of heat dissipating parts. The water repellent part 300 may be, for example, silicon. The flexible thermoelectric device 100 may be attached to the human body in many cases, and a wearable device attached to the human body frequently comes into contact with water, and the water repellent part 300 provided between the heat dissipating parts 200c as above may prevent the radiative cooling part 200 from being separated from the heat dissipating part due to friction with water. Additionally, a height (thickness) of the water repellent part 300 may be formed to be higher than a height (thickness) of the cooling part 200. This may further prevent water from coming into contact with the cooling part 200 to improve the waterproof performance of the radiative cooling part 200.

The flexible thermoelectric device 100 including the radiative cooling part 200 as described above reflects ultraviolet rays, visible rays, and near infrared rays of sunlight, emits infrared rays of 8 to 13 micrometers to perform radiative cooling, and lowers a temperature of the heat dissipating part 120 through radiative cooling to increase a temperature difference with the heat absorbing part 110, thereby improving power generation performance of the flexible thermoelectric device.

The technical idea should not be construed as being limited to the embodiment of the present invention described above. Various modifications may be made at the level of those skilled in the art without departing from the gist of the present invention as claimed in the claims. Accordingly, such improvements and modifications fall within the scope of the present invention as long as it is apparent to those skilled in the art.

DESCRIPTION OF REFERENCE NUMERALS

100: flexible thermoelectric device
110: heat absorbing part
120: heat dissipating part
130: first thermoelectric leg
140: second thermoelectric leg
151: lower electrode
152: upper electrode
200, 200a, 200b, 200c: radiative cooling part
300: water repellent part

The invention claimed is:

1. A flexible thermoelectric device including a heat dissipating part formed of a flexible material, the flexible thermoelectric device comprising:
a radiative cooling part provided on an outer surface of a heat dissipating part to cool the heat dissipating part by radiative cooling;
wherein the heat dissipating part comprises a metal foil, and the radiative cooling part is provided on the outer surface of the heat dissipating part,
wherein the radiative cooling part is formed of a thin film, has a thickness of 500 micrometers to 1000 micrometers and is formed to have flexible thickness,
wherein the radiative cooling part is composed of a plurality of radiant cooling parts, which the plurality of radiative cooling parts are coupled to form a predetermined pattern on the heat dissipating part and spaced apart from each other on the heat dissipating part,
wherein a water repellent part is provided in a space between the plurality of radiant cooling parts and is formed of a water repellent material, and
wherein a height of the water repellent part is formed higher than a height of the radiative cooling parts to prevent detachment of the radiative cooling parts caused by friction with water.

2. The flexible thermoelectric device of claim 1, wherein the radiative cooling part is formed of a material emitting infrared rays in a wavelength range of 8 to 13 micrometers by electromagnetic resonance to cause radiative cooling.

3. The flexible thermoelectric device of claim 1, wherein the radiative cooling part is attached to the outer surface of the heat dissipating part through an adhesive, and the adhesive includes an epoxy-based resin having high thermal conductivity or an olefin-based resin having high thermal conductivity.

4. The flexible thermoelectric device of claim 1, wherein the radiative cooling part is formed by applying the radiative cooling material on the outer surface of the heat dissipating part.

5. The flexible thermoelectric device of claim 1, wherein the radiative cooling part is formed of a flexible material to maintain a state in close contact with the heat dissipating part.

6. The flexible thermoelectric device of claim 1, wherein the plurality of radiative cooling parts is stretchable and disposed on the heat dissipating part and spaced apart from each other at a predetermined distance so as to be coupled to each other to form a predetermined pattern on the heat dissipating part.

7. The flexible thermoelectric device of claim 1, wherein the radiative cooling part is in the form of a thin film coupled to the outer surface of the heat dissipating part, the thin film having pores having a diameter of nano or micrometer units.

* * * * *